United States Patent [19]

Quick

[11] Patent Number: 5,145,741
[45] Date of Patent: Sep. 8, 1992

[54] CONVERTING CERAMIC MATERIALS TO ELECTRICAL CONDUCTORS AND SEMICONDUCTORS

[76] Inventor: Nathaniel R. Quick, 44 Center Grove Rd., H15, Randolph, N.J. 07869

[21] Appl. No.: 665,574

[22] Filed: Feb. 28, 1991

Related U.S. Application Data

[63] Continuation-in-part of Ser. No. 361,506, Jun. 5, 1989.

[51] Int. Cl.$^5$ .................... B05D 3/06; B05D 5/12; B05D 3/02
[52] U.S. Cl. .................... 428/402; 427/53.1; 427/126.2; 427/96; 427/227; 437/173; 428/410; 428/409; 428/698; 428/699; 428/702; 428/701; 428/704
[58] Field of Search ............. 427/53.1, 54.1, 126.3, 427/126.4, 96, 227, 55, 56.1, 126.2, 402, 409, 410, 698, 701; 428/702, 704, 366, 367, 368, 373, 699; 437/173

[56] References Cited

U.S. PATENT DOCUMENTS

| | | | |
|---|---|---|---|
| 4,309,224 | 1/1982 | Shibata | 427/53.1 |
| 4,339,285 | 7/1982 | Pankove | 427/53.1 |
| 4,372,989 | 2/1983 | Menzel | 427/53.1 |
| 4,496,607 | 1/1985 | Mathias | 427/53.1 |
| 4,539,251 | 9/1985 | Sugisawa et al. | 428/699 |
| 4,565,712 | 1/1986 | Noguchi et al. | 427/53.1 |
| 4,663,826 | 5/1987 | Baeuerle | 427/53.1 |
| 4,761,339 | 8/1988 | Komatsu et al. | 428/699 |
| 4,840,853 | 6/1989 | Iio et al. | 428/699 |
| 4,847,138 | 7/1989 | Boylan et al. | 427/53.1 |
| 4,880,770 | 11/1989 | Mir et al. | 427/53.1 |
| 4,912,087 | 3/1990 | Aslam et al. | 427/126.3 |
| 4,950,558 | 8/1990 | Sarin | 428/704 |
| 4,988,564 | 1/1991 | D'Angelo et al. | 428/367 |
| 5,015,618 | 5/1991 | Levinson | 427/53.1 |

Primary Examiner—Marianne Padgett
Attorney, Agent, or Firm—Clay Holland, Jr.

[57] ABSTRACT

In a preferred embodiment room temperature electrically conductive or semiconductive ceramic paths or areas are produced on carbide and nitride ceramic substrates by a process of controlled oxidation using localized thermal heating (e.g., laser heating) by tracing desired paths onto the substrates, where air is the source of oxygen. In another embodiment, nitride and carbide ceramic substrates are converted to electroconductive or semiconductive ceramics where the substrate is characterized as whiskers, fibers, flakes or platelets whose dimensions are in the micron range, by controlled oxidation as prescribed by laser beam processing. The resulting conductive or semiconductive paths or surfaces of the substrate comprise electrically conductive or semiconductive nonstoichiometric aluminum-nitrogen-oxygen ceramic, when the initial ceramic substrate material is aluminum nitride(AlN); and electrically conductive or semiconductive nonstoichiometric silicon-carbon-oxygen ceramic, when the initial ceramic material used is silicon carbide (SiC). The path cut into the surface on a flat substrate can serve e.g. as electrical interconnects akin to printed circuitry on a wiring board and patterns of semiconductors formed can serve e.g. as semiconductive devices akin to rectifier devices. In the instance of the whiskers, fibers, flakes or platelets, the electrically conductive surfaces thereof may be used directly or enhanced for example, by coating other conductor metal or alloys onto the surface for uses e.g. as composite materials in matrices at the microstructural level.

22 Claims, 6 Drawing Sheets

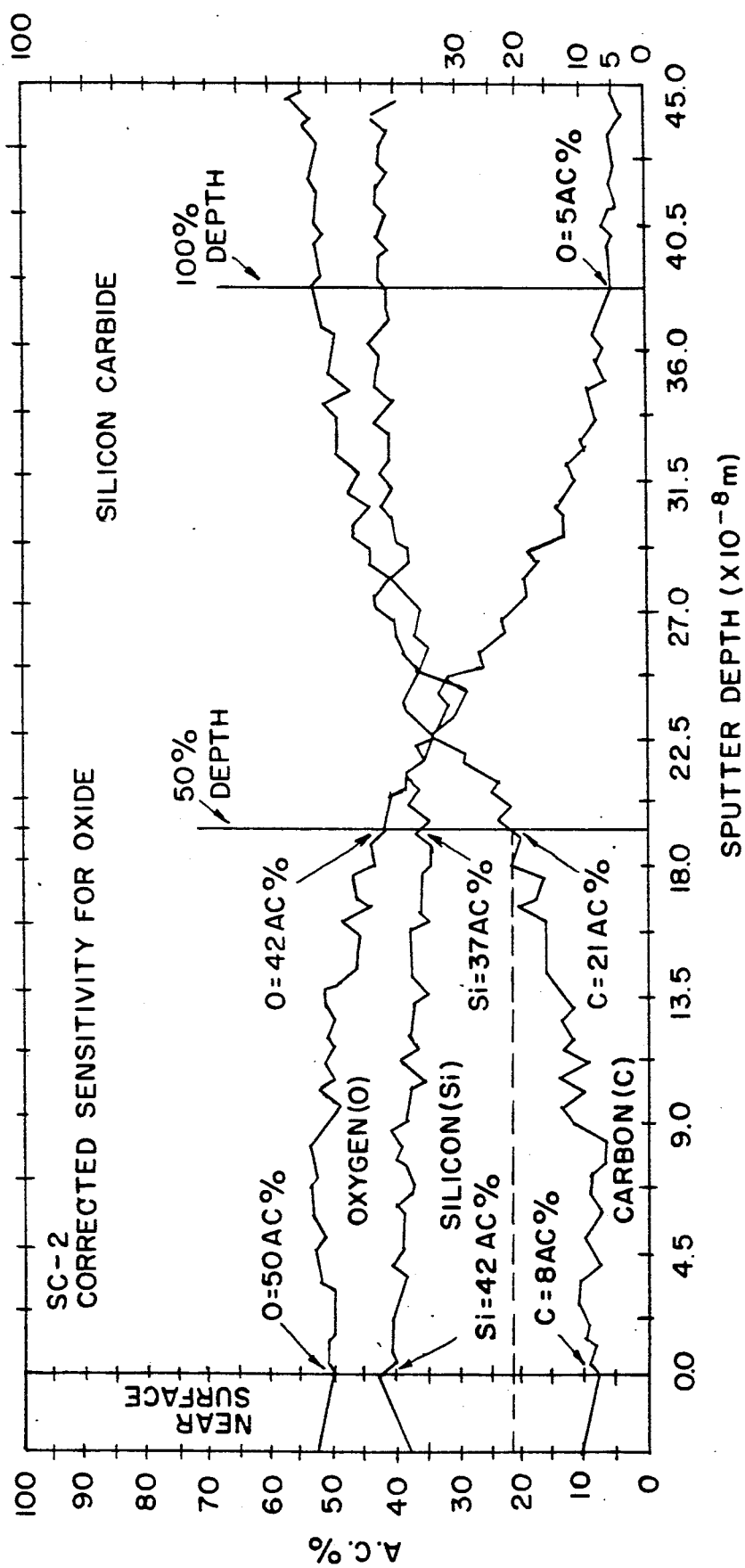

CONVERTING CERAMIC MATERIALS TO ELECTRICAL CONDUCTORS AND SEMICONDUCTORS

This is a continuation-in-part of application Ser. No. 361,506, filed Jun. 5, 1989, entitled "CONVERTING CERAMIC MATERIALS TO ELECTRICAL CONDUCTORS AND SEMICONDUCTORS", inventor Nathaniel R. Quick, which is still pending as of this filing and will become abandoned upon the effective filing of this application.

FIELD OF THE INVENTION

This invention relates to methods for producing ceramic conductive and semiconductive patterns or surfaces on ceramic substrates such as metal carbides, nitrides borides and mixtures thereof, as may be used, e.g. in the manufacture of monolayer or multilayer circuit boards, integrating substrates and the like; for semiconductor devices; and for components of composite materials in matrices.

BACKGROUND OF THE INVENTION

In the prior art ceramics having hexagonal crystalline structures such as carbides and nitrides, having melting temperatures on the order of 2000 to 3000 degrees C., have been used traditionally as electrical insulators (dielectrics) for circuit boards, chip-carriers and the like. However, they have not heretofore been known to exhibit conductive or semiconductive properties when exposed to thermal heat processing in an air atmosphere in connection with their traditional uses or applications.

More specifically, in the prior art conductive patterns on polymer or ceramic substrates such as, printed circuit boards typically are used to provide interconnections between devices attached to the substrates. Various methods have been used for the production of conductive patterns, such as dry-film imaging and screen printing; for further details on these processing technologies see, e.g., the book by R. H. Clark, Handbook of Printed Circuit Manufacturing, Van Nostrand Reinhold Co., 1985.

More recent prior art methods may use a laser to assist in the production of the conductive patterns on such substrates; several of these techniques are briefly described hereinbelow with reference to known patented techniques:

In U.S. Pat. No. 4,159,414, issued Jun. 26, 1979, to Nam P. Suh, et. al., entitled "Method for Forming Electrically Conductive Paths", there is disclosed a method for forming electrically conductive paths on a substrate made of a composition of a polymer material having preferrably a metal oxide incorporated as a filler therein. A selected surface is heated by a high intensity laser beam, at the locations where the paths are to be formed to a temperature sufficient to reduce the metal compound to its elemental state whereby the desired electrically conductive paths are formed.

In U.S. Pat. No. 4,496,607, issued Jan. 29, 1985, to Eckart Mathias, entitled "Laser Process for Producing Electrically Conductive Surfaces on Insulators", there is disclosed a process for producing electrically conductive surfaces on insulating substrates using a laser beam to melt tracks onto the substrate into which conductive metal particles are simultaneously impinged, thereby resulting in the formation of computer controlled patterns designed according to tracings characteristic of those used in the manufacture of electric/electronic circuit boards.

In U.S. Pat. No. 4,691,091, issued Sep. 1, 1987, to Alan M. Lyons, et. al., entitled "Direct Writing of Conductive Patterns", there is disclosed a method for producing electrically conductive paths on a polymeric substrate by laser writing, i.e. tracing desired paths on the substrate by a laser beam. The resulting paths are conductive carbon as produced by thermal decomposition of substrate surface material. The paths can serve as electrical interconnections akin to printed circuitry on a wiring board. Optionally, the conductivity of the paths may be enhanced by electroplating a suitable conductor metal or alloy onto the paths.

In U.S. Pat. No. 4,710,253, issued Dec. 1, 1987, to Peter Soszek, entitled "Method for Manufacturing a Circuit Board", there is disclosed a circuit board manufactured by applying a film of heat activated adhesive to a substrate and depositing on the film a layer of a conductive powder. The powder and film are then activated by laser radiation. The excess powder is then removed and the substrate fired to cure or bond the powder to the substrate while removing excessive adhesive film.

In U.S. Pat. No. 4,847,138, issued Jul. 11, 1989 to Elizabeth A. Boylan, et. al., entitled "Thermal Writing on Glass and Glass-Ceramic Substrates", there is disclosed a method of producing a transition metal pattern on a glass or glass-ceramic substrate by selective exudation (precipitation) of a transition metal from a glass containing the metal as an oxide. The selective exudation is effected by applying an intense, well focused source of energy to the glass in a pattern corresponding to the desired metal pattern. This develops localized heating, and thereby causes corresponding localized metal exudation from the glass. In this patent the substrate is preferrably loaded with 1-20 percent metal oxide that is known to exude when exposed to localized thermal exposure.

In U.S. Pat. No. 4,880,770, issued Nov. 14, 1989, to Jose M. Mir, et. al., entitled "Metalorganic Deposition Process for Preparing Superconducting Oxide Films", there is disclosed the use of a laser to anneal metal oxide ceramic to recrystallize an amorphous layer to make that layer electrically conductive. This prior art patent relates to the production of super-conducting oxide films which are well known as exhibiting electroconductive properties only at cryogentic temperatures, and therefore, is instructive herein as to the use of lasers to provide localized thermal exposure in preselective pattern areas for annealing purposes.

In U.S. Pat. No. 4,912,087, issued Mar. 27, 1990, to Mohammad Aslam, et. al., entitled "Rapid Thermal Annealing of Superconducting Oxide Precursor Films on Si and $SiO_2$ Substrates", there is disclosed a method of preparing a superconducting metal oxide film on silicon and silicon dioxide substrates. A superconducting metal oxide precursor is deposited directly on the substrate by vapor depositon and then subjecting it to rapid thermal annealing in an oxygen atomosphere so that a superconducting metal oxide film on silicon and silicon dioxide is formed. The resulting products formed are superconducting metal oxides which are operable only at cryogenic temperatures that is different from the present invention which is operable at non-cryogenic temperatures.

In another example of the prior art, see Laser and Applications, Sep. 1986, page 40, where there is disclosed a process where a chip laden circuit board is placed in a sealed, chemical-vapor-deposition cell. After the cell is pumped out, a gas, for example tungsten-hexafluoride, is fed in. A laser is then focussed through a window in the cell and onto the circuit board. As the laser beam impinges along a prescribed path on the board surfaces, it strips tungsten from the gas and deposits it as a thin metallic line on the surface of the sample.

As can readily be appreciated from the foregoing discussions of the prior art, it is desireable to find a method and materials by which conductive or semiconductive path or surfaces can be readily adapted for the formatiom of conductive or semiconductive surfaces heretofore unknown.

BRIEF SUMMARY OF THE INVENTION

In accordance with the teachings of this invention, it has been discovered that recently developed commercially available electrically insulative crystal structured binary ceramics, such as silicon carbide, aluminum nitride and boron nitride, as examples, having resistivities greater than $10^{11}$ ohm-cm, have excellent thermal dissipation properties. It can be inferred that these same ceramic materials also have excellent thermal absorptive properties. Extensive experimentation with these thermal properties have proven them to be ideal candidates as substrates for a wide range of electrical applications, where thermal management of such substrates is sought. Further evaluation and experiments utilizing these excellent thermal properties lead to the discovery that these electrically insulative ceramic' compounds can be converted to electroconductive ternary ceramic compounds when suitably oxidized by laser beam exposure.

After extensive evaluation and experimentation, it has been discovered, in accordance with a preferred embodiment of the invention, that a conductive ceramic path can be formed by utilizing a ceramic substrate which may be aluminum nitride or silicon carbide as examples, as the medium upon which paths are created. Conductive or semiconductive paths are obtained by selectively directing a laser beam operating in the $TEM_{00}$ or else multi-mode from a Nd:YAG laser, in an air atmosphere, onto the surface of the substrate to thereby cause the formation of the desired conductive or semiconductive patterns. The selected application of a laser beam to the substrate surface is characterized as controlled oxidation of the path on the surface exposed to the laser beam, whereby nonstoichometric aluminum-nitrogen-oxygen ceramic paths thereon may be said to be formed, when aluminum nitride (AlN) is utlized. The ternary compound formed, is comprised of a metal element and two nonmetal elements, is expressed in a formula such as a %Al-b %N-c %O , where a %, b %, and c % represent numerical atomic concentration percents, such as where a % = 33–50 atomic concentration % b % = up to 50 atomic concentration % c % = up to 60 atomic concentration % when aluminum nitride substrates are utilized. When silicon carbide is used, silicon-carbon-oxygen ceramic paths are formed. The ternary compound formed consists of one semi-metal element and two non-metal elements, and may be expressed in the formula a %Si-b %C-c %O, using the same notations as above, where a % = 33–50 atomic concentration % b % = up to 50 atomic concentration % c % = up to 60 atomic concentration %

Ternary compounds of these types are not known to have been prevously reported in technical journals by applicant and which has been confirmed by personal communiqe from Professor Dennis Readey, Chairperson, Colorado School of Mines.

BRIEF DESCRIPTION OF THE DRAWINGS

The invention can be described in more detail with the help of the accompanying drawings wherein:

FIG. 5, is a plot of a Perkin-Elmer PHI 660 Scanning Auger Microprobe depth profile of a ceramic electroconductive or semiconductive path formed on a silicon carbide substrate with a Nd:YAG Q-switched pulsed laser;

DETAILED DESCRIPTION

Figure 1:
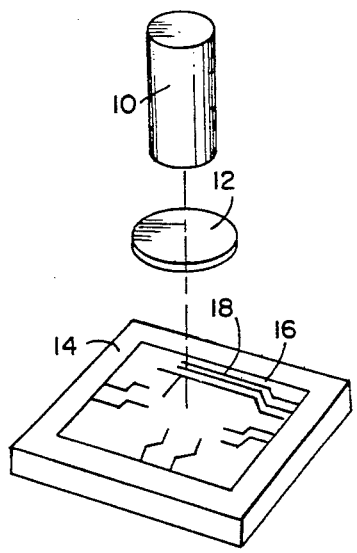
FIG. 1, shows an arrangement for practicing the invention.

Shown in FIG. 1, is a laser 10, movable mirror 12, x-y-programmable table 14, and ceramic substrate 16. The mirror 12 can be moved to direct a laser beam across the substrate 12 providing focussed thermal energy thereon to trace a desired pattern 18. Conversely, a pattern can be traced by moving table 14.

Among suitable substrate materials identified for processing in accordance with the present invention are ceramic materials, such as e.g. aluminum nitride, silicon carbide, boron nitride or any other ceramic which couples with a laser beam as taught in this disclosure. Among specific recently available commercial materials are silicon carbide (80024), aluminum nitride (70184) and boron nitride (8808-22M26) manufactured by Carborundum Electronic Ceramics. Preferred substrates have characteristics that permit efficient absorption or coupling of laser thermal energy produced by a Nd:YAG.

More specifically, it has been discovered pursuant to the teachings of this invention that those insulator materials exhibiting a hexagonal crystal structure, a heat of formation not less than $-150$ kcal/mole and a thermal diffusivity in the range of 0.2 cm /s to 1.0 cm / are a materials group appropriate for conversion from an insulator state to an electroconductor or semiconductor.

In accordance with the present invention I have discovered that a laser suitable for use with the preferred embodiment of the invention is Nd:YAG Q-switched laser, available from Control Laser (Instamark/Elite) to produce focussed thermal energy to a substrate. The data derived in accordance with the invention shows a strong dependence of the process upon the laser pulse repetition rate, average laser power and pulse scan rate. Stated differently, these laser characteristics have a processing effect upon the emissivity, heat of formation and thermal diffusivity of the ceramic substrate which are the material properties that enable the selected laser to be compatible with substrate material for optimization of the process parameters to thereby produce controlled oxidation and thermal disassociation of substrate pattern traces to effectuate the conversion process disclosed by the invention.

In the more advanced microelectronics field it is recognized that electronic grade ceramics are generally composed of inorganic nonmetallic materials, i.e. binary compounds of metal oxides, carbides, nitrides and borides. These electronic grade materials are generally considered to be chemical mixtures or compounds, where the smallest chemical units are molecules of these elements, mixtures or compounds. They are fabricated via sintering or tape casting processes and have decomposition temperatures on the order of or greater than 2000 deg. C. When these materials are in a hexagonal crystal structure, i.e. such as alpha-silicon carbide, aluminum nitride and boron nitride, they exhibit electrical resistivities on the order of or greater than $10^{11}$ to $10^{15}$ ohm-cm. However, polymorphs of some of these materials, particularly silicon carbide, are believed to exhibit some limited degree of conductivity and are believed therefore more adaptable to the conversion process of the present invention.

In accordance with the discoveries of this invention, certain of these materials, i.e. aluminum nitride, silicon carbide and boron nitride, can be selectively converted to conductive or semi-conductive morphologies by controlled oxidation and rapid solidification of the melt on the order of $10^8$ to $10^{10}$ deg C./sec., by preselected laser pulse processing. Such thermal exposure with a laser beam in air, causes controlled oxidation and thermal pyrolysis, decomposition or disassociation to the exposed substrate surface. The use of the terms disassociation, decomposition or pyrolysis are all considered as equivalent for purposes of this disclosure and may be used interchangeably when used in connection with the process of controlled oxidation and rapid solidification of the pattern traces on a substrate.

The resultant ceramic conductor depth profile of alpha-silicon carbide can be seen with reference to FIG. 5. The Auger electron spectra and depth profile analysis were conducted using sputter rates approximated from a silicon oxide standard to be 100 Angstroms per minute for purposes of all Auger anlysis disclosed herein. As shown in FIG. 5, a silico-carbon-oxygen compound is formed exhibiting decreasing oxygen atomic concentration percent and increasing carbon atomic concentration percent in moving through the path depth (0.38 micron or $38 \times 10E-8m$), from its surface to its base. This base depth (path thickness), that of the starting insulative ceramic materials, is defined as the depth where the oxygen concentration is decreased to 5 atomic concentration %.

Figure 2:
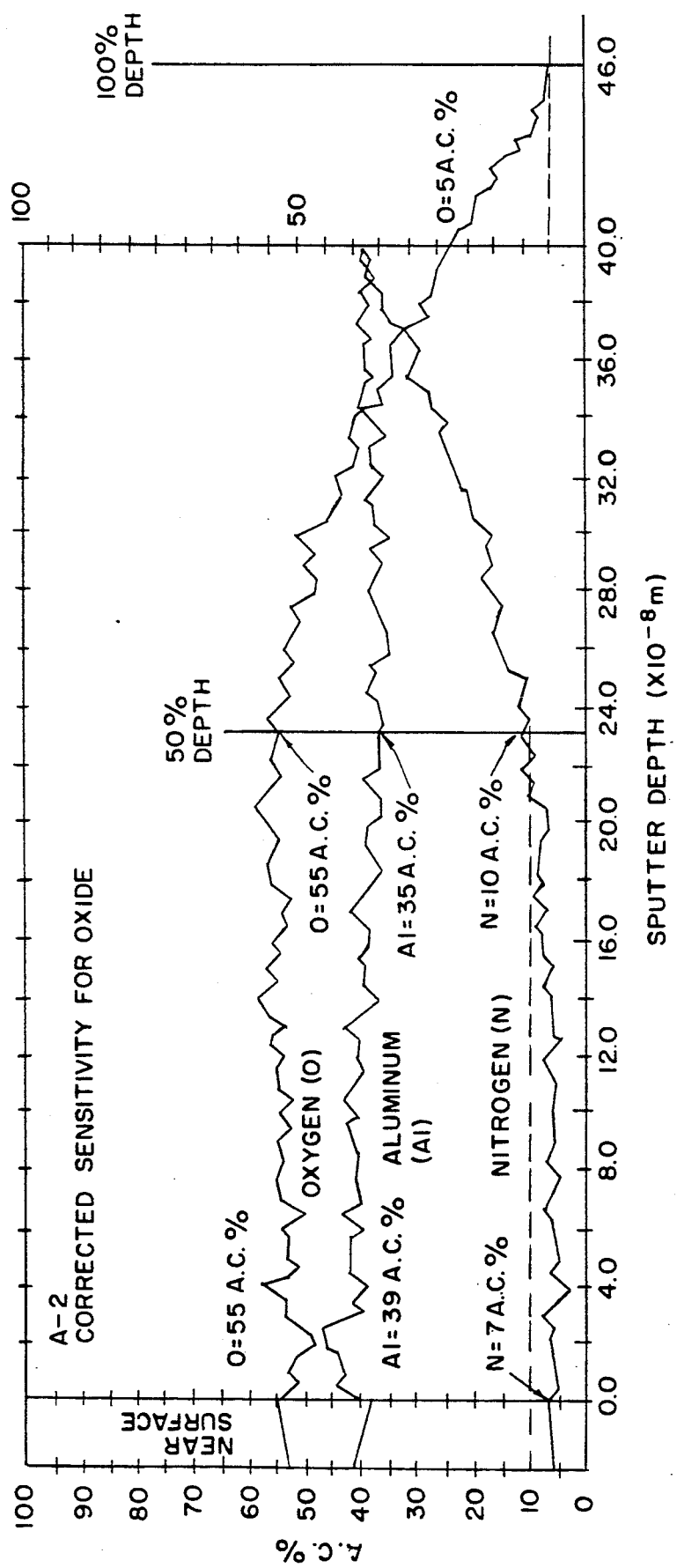
FIG. 2, is a plot of a Perkins-Elmer PHI 660 Scanning Auger Microscope depth profile of an electroconductive ceramic path formed on aluminum nitride substrate with Nd:YAG Q-switched pulsed laser.

In a similar manner, the resultant ceramic conductor depth profile of aluminum nitride can be seen by referring to FIG. 2. As shown in FIG. 2, an aluminum-nitrogen-oxygen compound is shown to be formed exhibiting decreasing oxygen atomic concentration percent and increasing nitrogen atomic concentration percent moving through the path depth (0.46 micron or $46 \times 10E-8m$) from its surface to its base. This base depth (path thickness). that of the starting insulative ceramic materials, is defined as the depth where the oxygen concentration is decreased to 5 atomic concerntration percent. FIG. 2 as shown is not extended to show this intercept as it is in the case of FIG. 5.

The electroconductive or semiconductive ceramics of the above described compounds created or derived by the use of pulsed laser processing are believed to be new and unique since no reported information thereof is known or uncovered after extensive search thereof.

Figure 8:
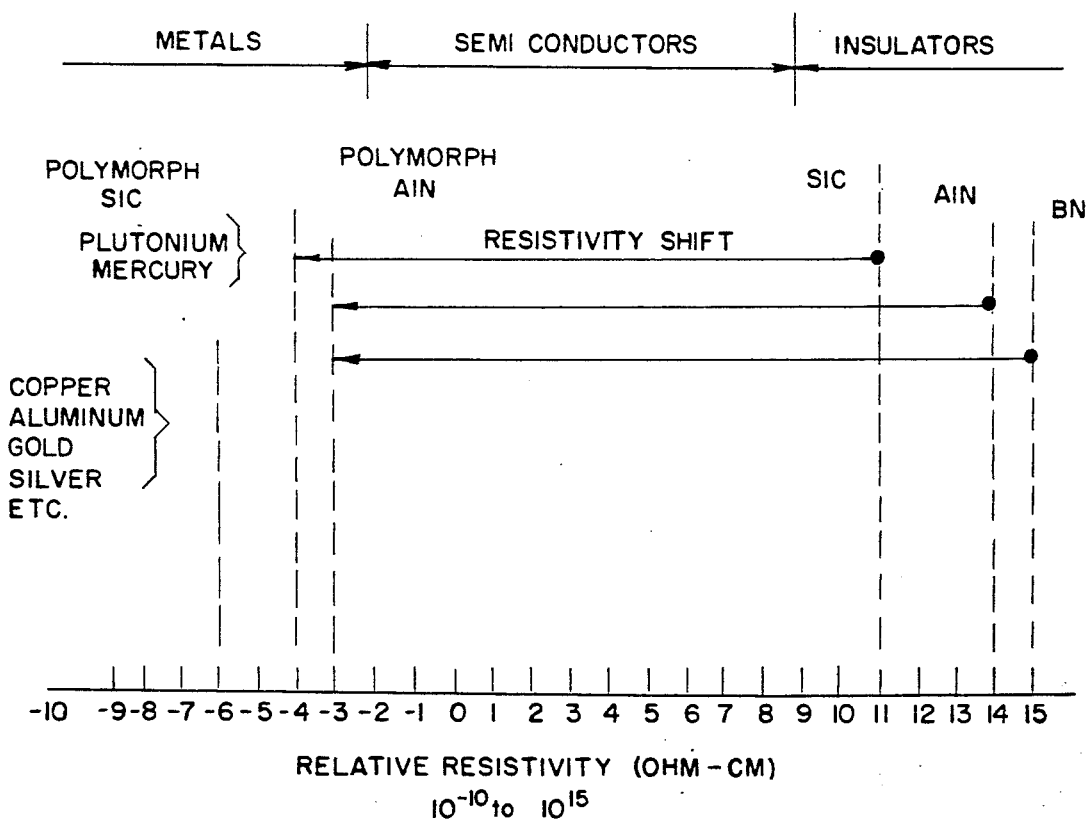
FIG. 8, is a graphic spectrum distribution of relativities showing a range for metal, semiconductors and insulators.

With reference now to FIG. 8, there is shown a relative resistivity (ohm-cm) spectrum from $10^{-10}$ to $10^{15}$, which covers the range of ($10^{-10}$ to $10^{-2}$ ohm-cm), semiconductors ($10^{-2}$ to $10^9$ ohm-cm), and insulators ($10^9$ to $10^{15}$ ohm-cm). As can readily be seen AlN, SiC and BN all fall in the area greater than $10^{11}$ as insulators. Upon closer examination there is shown a dramatic shift in these materials, as a result of their conversion to an electroconductor, which fall in the range designated for conductors, i.e., the oxidized aluminum nitride and boron nitride as converted having a resistivty on the order of $10^{-3}$ ohm-cm, while the oxided silicon carbide has a resistivity on the order of $10^{-4}$ ohm-cm, both measured at 21 deg. C. (294 deg. k). FIG. 8 further illustrates a dramatic shift in these materials 12 orders of magnitude. FIG. 8, also illustrates how close in resistivity these new ceramics comes to such conductors as copper, aluminum, gold, silver, mercury and plutonium etc. which have relative resistivities in the $10^{-6}$ to $10^{-4}$ ohm-cm range. It should be noted at this point, that these ceramic materials may be processed such that the ceramics do not go beyond a resistivity of $10^{-1}$ ohm-cm, so as to be in the semiconductor range.

Figure 4:
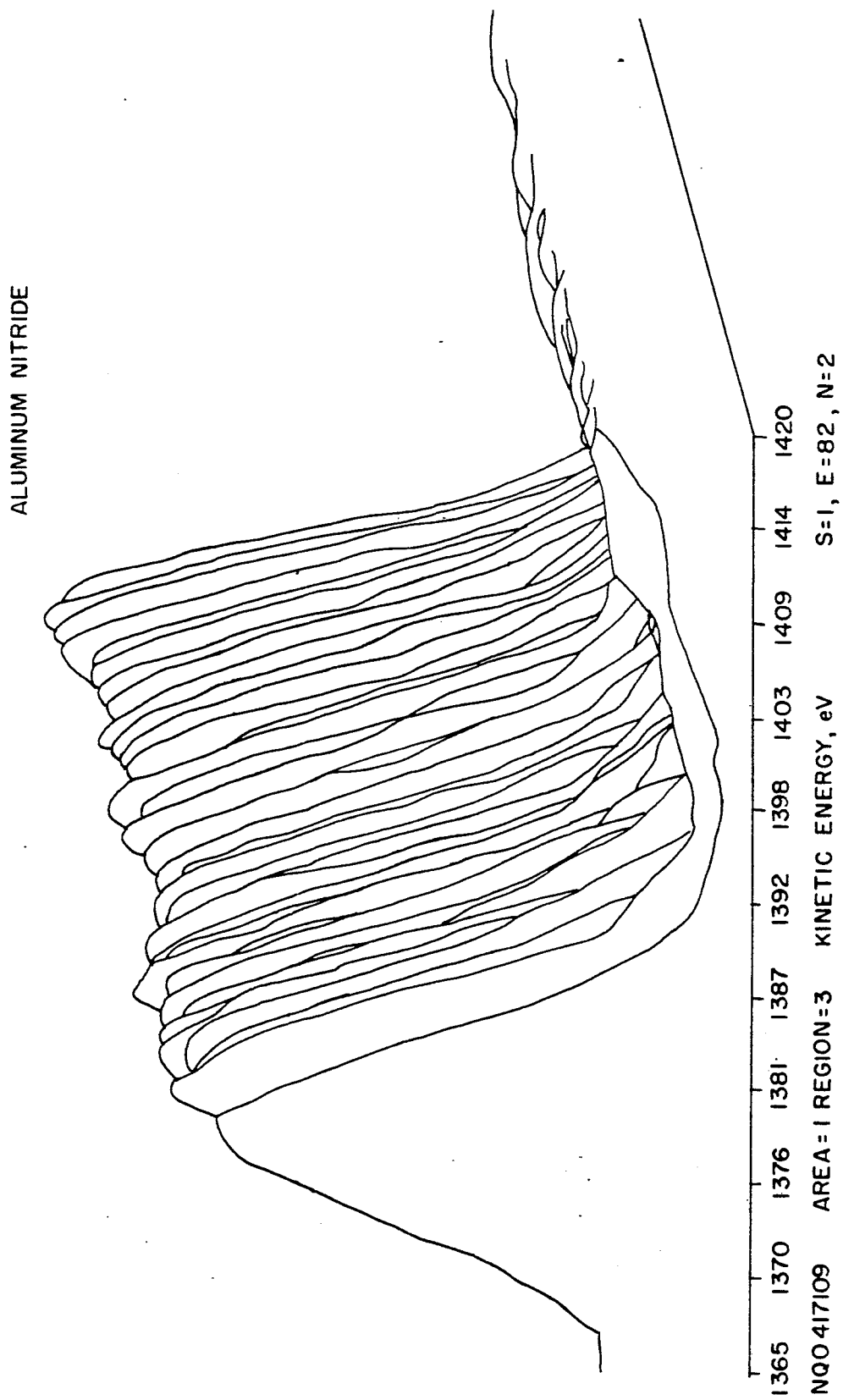
FIG. 4, is a montage plot from a Perkin-Elmer PHI 660 Scanning Auger Microprobe of a ceramic ceramic electroconductive path depth profile formed on an aluminum nitride substrate with a Nd:YAG Q-switched laser.
Figure 7:
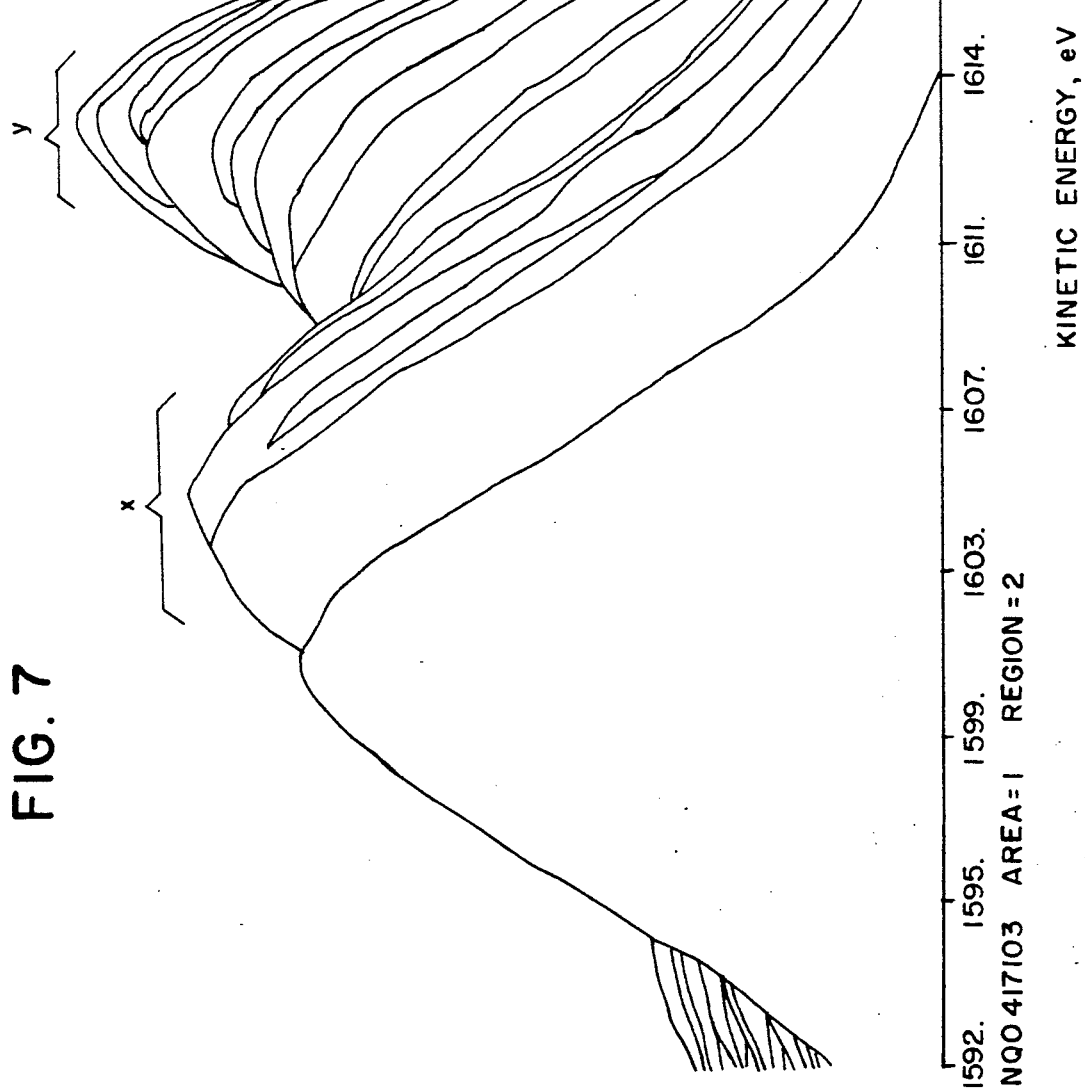
FIG. 7, is a montage plot of a Perkin-Elmer PHI 660 Scanning Auger Microprobe of an electroconductive or semiconductive ceramic path depth profile formed on a silicon carbide substrate with Nd:YAG Q-switched pulsed laser.

To continue, reference is made to FIGS. 4 and 7, where there is shown montage plots of depth profiles of two of these materials by the Scanning Auger Microprobe as further examination and analysis of the effects of the laser process. In FIG. 7, there is shown a dramatic change in the montage plot of silicon carbide ceramic illustrating by the apparent "shift" in the peaks, designated x and y in the figure. This shift in peaks. implies that the silicon carbide has under gone a more significant change in chemistry, when oxidized, as compared to the aluminum nitride, moving toward a more "electroconductive type" species, i.e., from a resistivity on the order of $10^{11}$ ohm-cm to $10^{-4}$ ohm-cm.

In view of these findings as exemplified by the data disclosed and taught herein, it is safe to infer that those ceramics which meet the materials criteria noted hereinabove, namely, those materials exhibiting a hexagonal crystaalline structure, heat of formation and thermal diffussivity in the ranges disclosed are candates for the conversion process to electroconductive or semiconductive ceramics as disclosed by the teachings of the present invention.

While the resistivity of silicon carbide, aluminum nitride and boron nitride are greater that that of copper ($10^{-6}$ ohm-cm) as compared to $>10^{11}$ ohm-cm for silicon carbide; $>10^{14}$ ohm-cm for aluminum nitride; and $10^{15}$ ohm-cm for boron nitride, electroconductive and semiconductive patterns made in accordance with the present invention can be made for a variety of pracital and useful applications from these insulative ceramic materials heretofore unknown or realized in the prior art. For example, ceramic conductive paths are realized in SiC having a resistivity of $5.2\times10^{-4}$ ohm-cm and in AlN having a resistivity of $5.1\times10^{-3}$ ohm-cm, both measured at 21 deg. C.(294 deg.k), which is adequate for some circuit board conductors and interconnect applications, including keypad, hybrid circuits, multilayer circuits and integrating substrates.

One of the most notable features of the invention, arises from the fact that it teaches clearly that an insulative ceramic material can be converted to a ceramic electroconductor or semiconductor by changing the resistivity by orders of magnitude, which constitutes a giant step in the advancement of microelectronics technology. It also suggests, that future improvements utilizing the teachings of this invention will not require overcoming as large an obstacle as has been overcome by this invention.

EXAMPLE 1 (AlN)

An experiment was carried out, on aluminum nitride, using a Nd:YAG laser (Quantronix Model 117, used in a Control Laser Instamark/Elite laser system) with an emission wavelength of 1064 nanometers to irradiate, thermal laser beam exposure, samples of the ceramic insulative material, 5 cm by 5 cm by 0,06 cm(70184) from Carborundum Ceramics. The laser was operated with a 7.6 cm focal-length lens and the focussed beam had a diameter of 0.0025 cm. Pattern formation was achieved by moving the aluminum nitride substrates with a programmable x-y table (Anorad) supporting the substrates, at a speed of approximately 0.1 to 0.2 cm/sec. and operating the laser with a pulse width not exceeding 400 nanosec., at a pulse repetition rate range of 2-10 khz, a rated continuous wave power oe 35 watts, Q-switched normalized average power of 0.84 (where 1 equals rated CW power). The experiment was performed in an ambient air atmosphere. Resistance (ohm per cm of length) was measured at 21 deg. C. (294 deg. k) using the four wire resistance mode of an HP3478A multimeter. The probes were spaced 0.5 cm apart and were gold plated and formed to make intimate contact with the narrow conductive paths. The resistivity of the path was $5.1\times10^{-3}$ ohm-cm.

The pulse energy necessary to produce patern traces of controlled oxidation during thermal pyrolysis at the substrate surface and to drive the conversion reaction was $8.05\times10^{-3}$ joules where the heat of formation was $-76$ kcal/mole, the thermal diffusivity was 0.96 cm/sec. and the emissivity was on the order of 0.30. Under the foregoing conditions the heating and cooling rates were in the range of $10^8$ to $10^{14}$ deg C./sec.(se ref. N. Bloembergen, "Fundamentals of Laser-Solid Interactions", Applications of Lasers in Materials Processing: Proceedings 18-20 Apr. 1979, Washington, D.C., ASM 1979, p. 1). These rates are sufficient to selectively melt recrystallize and solidify the aluminum nitride whose melting point is on the order of 2300 deg. C..

Under the foregoing conditions, the laser produced a ceramic electroconductor material region, pattern path, estimated as equivalent to the total laser heat effected zone which is 0.46 microns thick and 200 microns wide. Referring to FIG. 2, micrographic view of the trace shows that its center region is almost flush with the original substrate surface and slight troughs exist on both sides of the center region. As shown in FIG. 2, the near surface of the trace has the concentration as follows:

| Element | Atomic Concentration (%) |
|---------|--------------------------|
| Oxygen  | 55 |
| Aluminum | 39 |
| Nitrogen | 7 |

The atomic concentration percent for aluminum oxide ($Al_2O_3$) is about 40% aluminum and 60% oxygen. While that of aluminum nitride (Al N) is 50% aluminum and 50% nitrogen. As shown in FIG. 2, at a depth profile 50% into the ceramic electroconductive trace the compositin is as follows:

| Element | Atomic Concentration (%) |
|---------|--------------------------|
| Oxygen  | 55 |
| Aluminum | 35 |
| Nitrogen | 10 |

It should be noted that these have been rounded-off, and may not actually equal 100%.

The above data indicates that the material formed is nonstoichiometric. Averaging of the above data indicates that the material formed has the formula:

$$Al_{1\pm0.05} N_{0.23\pm0.06} O_{1.49\pm0.08}$$

The formula for stoichimetric alumina when written in this form would be:

$$Al\ O_{1.5}$$

As shown in FIG. 2, at a depth of 0.38 micron ($38\times10E-8m$), all concentration for all the elements are near equal. At this depth the formula would be as follows:

$$Al\ N\ O$$

The compositions formed with Boron Nitride would have the formulae as those for Aluminum Nitride; the Aluminum symbol (Al) being replaced by the Boron symbol (B) in the above equations.

EXAMPLE 2 (SiC)

In another experiment, analogous to Example 1, using Silicon Carbide substrates 5 cm by 5 cm by 0.06 cm thick (80024) material from Carborundum, using the same Nd:YAG laser, with 1064 nanometer wavelength, Q-switched; same spot size; a pulse repetition rate range (2-10 khz) and the same average power range. The resistance was measured using the same equipment and technique as in Example 1. A range of resistivities from $5.2\times10^{-4}$ ohm-cm to $6.8\times10^{-4}$ ohm-cm was measured with decreasing pulse energy. The pulse energy necessary to drive the conversion reaction was $3.15\times10^{-3}$ Joules or less, where the heat of formation was $-17.1$ to −1.75 kcal/mole, the thermal difusivity was 0.27 cm²/sec. and the emissivity was 0.83 to 0.93.

Figure 6C:
FIGS. 6A, 6B, and 6C are micrographs of an electroconductive or semiconductive ceramic path formed on a silicon carbide substrate showing three views thereof.
Figure 3:
FIG. 3, is a micrograph of a ceramic electroconductive path formed on an aluminum nitride substrate.
Figure 6A:
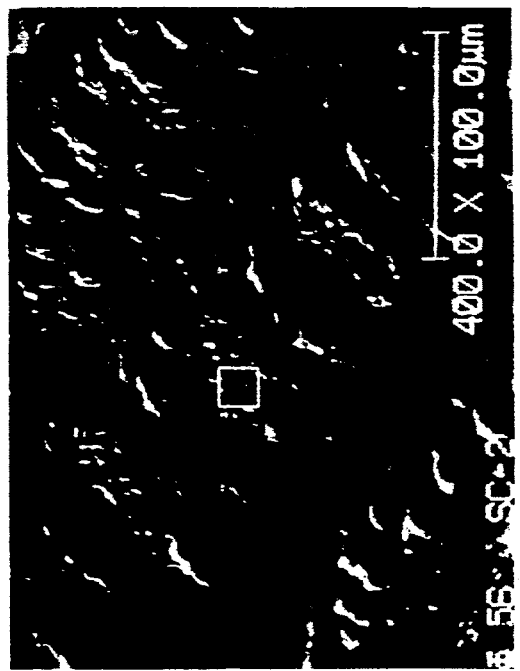
Figure 6B:
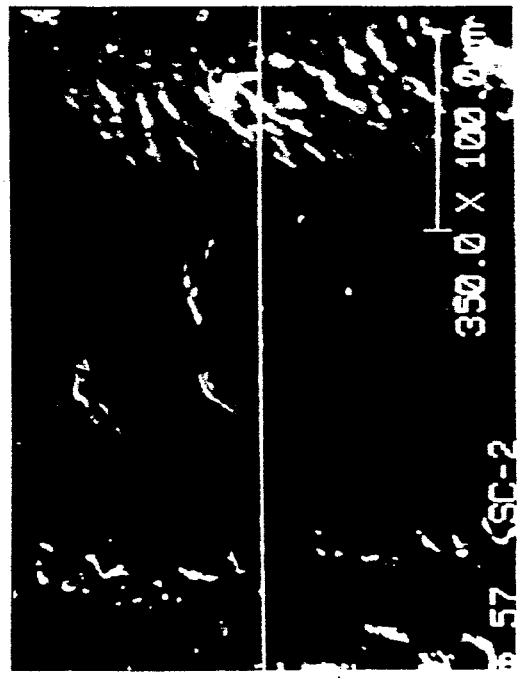

Under the foregoing conditions the laser produced a ceramic electroconductor path which was 0.38 micron thick and about 200 micron wide. Referring to FIGS. 6A-6C, it can be seen that the trace shows that its center region is almost flush with the original substrate surface (approximately 120 micron wide) and that deep troughs exist on both sides of the center region. Near the surface of the trace the composition is as follows:

| Element | Atomic Concentration (%) |
|---------|--------------------------|
| Oxygen  | 50 |
| Silicon | 42 |
| Carbon  | 8 |

The atomic concentration for silicon dioxide ($SiO_2$) is 33.3% silicon and 66.7% oxygen, while that of silicon carbide (SiO) is 50% silicon and 50% carbon.

Referring to FIG. 5, it can be seen that at a depth of 50% into the path thickness the atomic concentrations are as follows:

| Element | Atomic Concentration (%) |
|---------|--------------------------|
| Oxygen  | 42 |
| Silicon | 37 |
| Carbon  | 21 |

The above data indicates that the laser converted ceramic material is nonstoichiometric. Averaging of the above data gives the material formed the following formula:

$$Si_{1.0\pm0.06} C_{0.38\pm0.19} O_{1.18\pm0.18}$$

The formula for stoichiometric silicon dioxide written in this form is:

$$Si\ O_2$$

As shown in FIG. 5, it can be seen that at a depth of 0.225 micron (22.5×10E-8m) the atomic concentration of htese elements is near equal:

$$Si\ C\ O$$

The foregoing examples readily and adequately demonstrate that processing in accordance with the present invention of selective materials, represents a low cost and efficient alternative to the prior art, especially as applies to printed circuity where specific conductive patterns comprise relatively few features. The teachings of the invention are clearly applicable for use to produce rectifier, resistor, capacitance, microwave circutry, CMOS circuits, and the like circuit elements in a substrate (or microelectronics applications.

The applicability of the present invention and its uniqueness can be more readily appreciated when it is recognized that many microelectronic circuits and elements requirements thereof do not need the degree of resistivity disclosed herein in order to provide adequate resistivity to practical commercial circuit elements on a substrate. Further, it should be recognized that adjustments in the laser beam energy level and coupling parameters at the substrate surface, which determines the conversion process, may be made effectuate conversions in the semiconductive spectrum that represents a unique capability heretofore unknown or unrealized in the prior art.

It is to be understood that the above described embodiments are only illustrative of the principles applicable to the invention. Various other arrangements and modifications may be defined by those skilled in the art, without departing from the spirit and scope of the invention. For example, if an Argon Ion laser, $CO_2$ gas pulsed laser, or other focussed thermal energy sources such as tungsten arc lamps or electron beam sources are adapted to have similar or equivalent processing characteristics or parameters of the solid state pulsed Nd:YAG laser disclosed, it is inferred that similar ceramic electroconductive or semiconductive properties are attainable within the scope of the invention.

Consequently, the present invention is readily useful for the conversion of electronic substrate surfaces which are found not only on conventional flat electronic integrating substrates (ceramic circuit boards) or three dimensional integrating substrates, but may have configurations such as whiskers, fibers, flakes and platelets where such material configurations and electroconductive or semiconductive surface enables such particles to be readily adapted for uses as composite materials or matrices at the microstructural level. Accordingly, it is understood that the present invention is limited only by the spirit and scope of the disclosure and appended claims.

What is claimed as new is:

1. A method for directly converting at least a surface portion of a substrate of an insulative hexagonal crystalline ceramic compound to ceramic electroconductive or semiconductive traces in an oxygen containing atmosphere which penetrates said substrate surface to a selected depth therebeneath, said method comprising a step of directing a focussed thermal energy beam onto said surface portion and causing relative motion between beam and said substrate so as to delineate a pattern of said traces on said substrate, said motion being controlled so as to cause rapidly controlled oxidation and decomposition of said ceramic compound to said selected depth into said surface portion of said substrate, whereby said oxidation and decomposition of said surface portion of said ceramic compound, produced by said beam and rapid solidification of said surface portion causes direct conversion of said surface portion into said electroconductive or semiconductive ceramic traces which are non-hexagonal crystalline traces operable at non-cryogenic temperatures.

2. Method of claim 1 in which said focussed thermal beam is a laser beam.

3. Method of claim 2 in which said insulative crystalline ceramic is a nitride or carbide compound.

4. A method for directly converting at least a surface portion of a substrate of an insulative crystalline ceramic compound of nitride or carbide having a hexagonal crystalline structure to ceramic electroconductive or semiconductive surface, said method comprising a step of directing a focussed thermal energy laser beam onto said surface portion for selected thermal exposure thereof and causing relative motion between said beam and substrate so as to delineate pattern traces into said substrate in an oxygen containing atmosphere, said motion being controlled so as to cause rapidly controlled oxidation and decomposition of said surface portion of said ceramic compound substrate to a selected penetration depth into and beneath said surface portion of said substrate, whereby said oxidation and decomposition of said surface portion of said ceramic compound, produced by said beam exposure and rapid solidification of said surface portion, causes direct conversion of said traces of said surface portion of said substrate into said ceramic electroconductive or semiconductive surface having non-hexagonal crystalline structure and being operable at non-cryogenic temperatures.

5. Method of claim 4 in which said delineated traces penetrate into and beneath said subtrate surface to a depth on the order of at least 0.5 microns and having a width on the order of at least 5 microns.

6. Method of claim 4 in which said substrate is a whisker, fiber, flake or platelet.

7. Method of claim 4 in which said ceramic compound is an electrically insulative ceramic substrate of silicon carbide, aluminum nitride or boron nitride.

8. Method of claim 7 in which said electroconductive or semiconductive surface traces are nonstoichiometric.

9. Method of claim 7 in which said laser beam is deflected by a movable mirror.

10. Method of claim 9 in which said laser beam is produced by a Q-switched Nd:YAG laser or $CO_2$ laser or Argon ion laser.

11. Method of claim 10 in which said laser is a pulsed laser.

12. Method of claim 11 in which said electroconductive surface is a ternary compound that is 33-50 atomic concentration % aluminum, up to 50 atomic concentration % nitrogen and up to 60 atomic concentration % oxygen.

13. Method of claim 11 in which said electroconductive surface is a ternary compound that is 33-50 atomic concentration % silicon, up to 50 atomic concentration % carbon and up to 60 atomic concentration % oxygen.

14. Method of claim 11 in which said electroconductive surface is a ternary compound that is 33-50 atomic concentration % boron, up to 50 atomic concentration % nitrogen and up to 60 atomic concentration % oxygen.

15. Method of claim 11 in which said ceramic electroconductive material has a resisitivity less than $10^{-2}$ ohm-cm.

16. Method of claim 11 in which said ceramic semiconductive material has a resisitivity greater than $10^{-2}$ ohm-cm but less than $10^9$ ohm-cm.

17. Method of claim 11 in which said substrate has a heat of formation not less than $-150$ kcal/mole and a thermal diffusivity in the range of 0.2 $cm^2$/sec. to 1.0 $cm^2$/sec.

18. Method of claim 17 in which said substrate is a circuit board, integrating substrate, interconnection block or wiring board.

19. Method of claim 18 in which said conversion is a controlled oxidation and rapid solidification of said surface portion of said ceramic compound occurring at a rate on the order of $10^7$ to $10^{10}$ deg. C./sec.

20. Article of manufacture having a ceramic electroconductive or semiconductive electrical circuit pattern delineated thereon made by the method of claim 19.

21. A method for directly converting particles of insulative crystalline ceramic of aluminum nitride, silicon carbide or boron nitride having a hexagonal crystalline structure to ceramic electroconductive or semiconductive particles in an oxygen containing atmosphere when said particles have a dimension and morphology on the order of 0.50 microns thick and 200 microns wide, said method comprising a step of directing a focussed thermal energy pulse laser beam produced by a Q-switched Nd:YAG, $CO_2$ or Argon Ion laser onto said particles for selected thermal exposure thereof, said thermal exposure being controlled so as to cause rapidly controlled oxidation and decomposition of said entire particles, said particles being exposed having a heat of formation not less than $-150$ kcal/mole and a thermal diffusivity in the range of 0.2 $cm^2$/sec. to 1.0 $cm^2$/sec., whereby said oxidation and decomposition of said particles produced by said beam exposure and rapid solidification occurring at a rate on the order of $10^7$ to $10^{10}$ deg. C./sec., causes a direct conversion of said particles into said ceramic electroconductive or semiconductive particles with non-hexagonal crystalline structure and operable at non-cryogenic temperatures.

22. A material of manufacture being a particle of electroconductive or semiconductive material made according to the method of claim 21.

* * * * *